United States Patent

Becker et al.

(10) Patent No.: US 6,957,376 B2
(45) Date of Patent: Oct. 18, 2005

(54) TURBO DECODER AND TURBO DECODING METHOD

(75) Inventors: Burkhard Becker, Ismaning (DE); Markus Doetsch, Schliern (CH); Peter Jung, Otterberg (DE); Tideya Kella, München (DE); Jörg Plechinger, München (DE); Peter Schmidt, Ellerstadt (DE); Michael Schneider, München (DE)

(73) Assignee: Infineon Technologies AG, Munich (DE)

( * ) Notice: Subject to any disclaimer, the term of this patent is extended or adjusted under 35 U.S.C. 154(b) by 209 days.

(21) Appl. No.: 10/244,642

(22) Filed: Sep. 16, 2002

(65) Prior Publication Data

US 2003/0070136 A1 Apr. 10, 2003

Related U.S. Application Data

(63) Continuation of application No. PCT/DE01/00982, filed on Mar. 12, 2001.

(30) Foreign Application Priority Data

Mar. 16, 2000 (DE) .......................................... 100 12 874

(51) Int. Cl.[7] .......................... H03M 13/29; H03M 13/39
(52) U.S. Cl. .......................... 714/755; 714/780; 714/786
(58) Field of Search .................... 714/755, 780, 714/786

(56) References Cited

U.S. PATENT DOCUMENTS

| | | | | |
|---|---|---|---|---|
| 6,122,763 A | * | 9/2000 | Pyndiah et al. ............. | 714/755 |
| 6,161,209 A | * | 12/2000 | Moher ......................... | 714/780 |
| 6,182,261 B1 | * | 1/2001 | Haller et al. ................ | 714/758 |
| 6,252,917 B1 | * | 6/2001 | Freeman ..................... | 375/340 |
| 6,271,772 B1 | * | 8/2001 | Luschi et al. ................ | 341/51 |
| 6,339,834 B1 | * | 1/2002 | Crozier et al. .............. | 714/701 |
| 6,353,911 B1 | | 3/2002 | Brink .......................... | 714/780 |
| 6,516,437 B1 | * | 2/2003 | Van Stralen et al. ........ | 714/755 |
| 6,574,766 B2 | * | 6/2003 | Obuchi et al. .............. | 714/755 |
| 6,578,170 B1 | * | 6/2003 | Piret et al. ................... | 714/758 |
| 6,578,171 B1 | * | 6/2003 | Braneci et al. .............. | 714/786 |
| 6,580,767 B1 | * | 6/2003 | Koehler et al. ............. | 375/341 |
| 6,675,342 B1 | * | 1/2004 | Yagyu ......................... | 714/755 |
| 6,675,348 B1 | * | 1/2004 | Hammons et al. .......... | 714/790 |
| 6,678,843 B2 | * | 1/2004 | Giulietti et al. ............. | 714/701 |
| 6,678,857 B2 | * | 1/2004 | Sindhushayana et al. ... | 714/755 |
| 6,715,120 B1 | * | 3/2004 | Hladik et al. ............... | 714/755 |
| 6,732,327 B1 | * | 5/2004 | Heinila ....................... | 714/792 |
| 6,754,290 B1 | * | 6/2004 | Halter ......................... | 375/340 |
| 6,757,865 B1 | * | 6/2004 | Nakamura et al. .......... | 714/796 |
| 6,760,879 B2 | * | 7/2004 | Giese et al. ................. | 714/755 |
| 6,775,800 B2 | * | 8/2004 | Edmonston et al. ........ | 714/755 |

FOREIGN PATENT DOCUMENTS

EP  0 973 268 A1  1/2000

OTHER PUBLICATIONS

Masera G. et al.: "VLSI Architectures for Turbo Codes", IEEE, vol. 7, No. 3, Sep. 1999, pp. 369–379.
Jung P.: "Analyse und Entwurf digitaler Mobilfunksysteme" [Analysis and Design of Digital Mobile Radio Systems], B.G. Teubner, 1997, pp. 343–368.
Jung P.: "Comparison of Turbo–Code Decoders Applied to Short Frame Transmission Systems", IEEE, vol. 14, No. 3, Apr. 1996, pp. 530–537.

* cited by examiner

*Primary Examiner*—Stephen M. Baker
(74) *Attorney, Agent, or Firm*—Laurence A. Greenberg; Werner H. Stemer; Ralph E. Locher

(57) ABSTRACT

A turbo decoder for decoding a data signal transmitted via a disturbed channel has a symbol estimator and a digital signal processor. The symbol estimator performs two symbol estimations, and the DSP performs an interleaving and deinterleaving procedure, within a computing loop of the iterative turbo decoding. A bidirectional interface is provided for transferring data between the symbol estimator and the DSP.

9 Claims, 8 Drawing Sheets

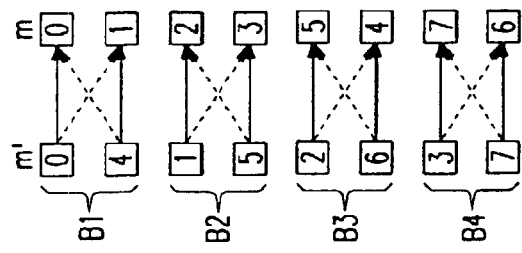
FIG. 8C
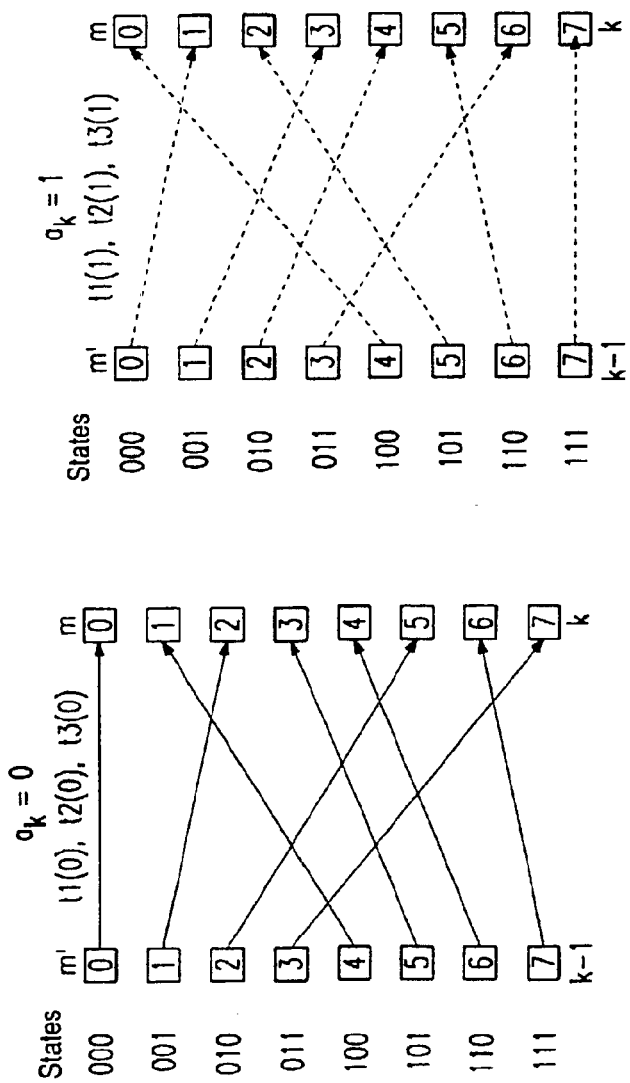
FIG. 8B
FIG. 8A
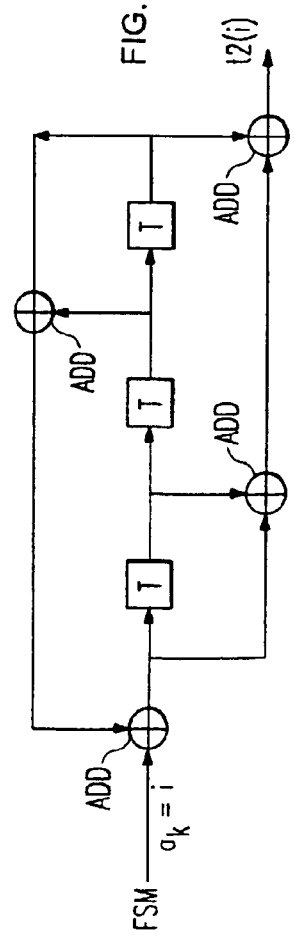
FIG. 8D

TURBO DECODER AND TURBO DECODING METHOD

CROSS-REFERENCE TO RELATED APPLICATION

This application is a continuation of copending International Application No. PCT/DE01/00982, filed Mar. 12, 2001, which designated the United States and which was not published in English.

BACKGROUND OF THE INVENTION

Field of the Invention

The invention lies in the communications and digital signal processing fields. More specifically, the invention relates to a turbo decoder for decoding a data signal that is error-protection-coded with a turbo code at the transmitter end, transmitted via a disturbed channel and detected in a receiver. The detected data signal is decoded iteratively in a computing loop programmed to perform the following computing steps: first symbol estimation of an input data signal, taking into consideration a first partly redundant data signal and a feedback data signal; interleaving of the data signal calculated in the first symbol estimation; second symbol estimation of the interleaved data signal, taking into consideration a second partly redundant data signal; and deinterleaving the data signal calculated in the second symbol estimation, for determining the feedback data signal. The computing loop is passed a plurality of times. The invention also pertains to a method for turbo decoding a data signal that is error-protection-coded at the transmitter end, transmitted via a disturbed channel, and detected in the receiver.

A basic problem in telecommunication consists in transmitting a data signal as free of errors as possible via a disturbed channel. To achieve this, the data signal to be transmitted is subjected to channel coding. The signal to be transmitted is adapted to the characteristics of the transmission channel by means of the channel coding. A multiplicity of different channel coding methods are used. The principle of channel coding (which is also called error protection coding) is based on achieving an effective error protection by selective introduction of redundancy into the signal to be transmitted.

Particular problems in conjunction with the signal transmission arise in mobile radio systems. This is attributable to the fact, on the one hand, that in mobile radio systems, decidedly severe signal distortions occur at the receiver due to time-variant multiple reflections, common-channel interference, Doppler shift and noise. On the other hand, the receiver of a mobile station only has limited power and hardware resources for reasons of space and cost. In mobile radio engineering, therefore, it is attempted to achieve a reconstruction of the transmitted signal with the least possible error rate as hardware-efficiently as possible (i.e. saving space and cost) with the least possible expenditure on signal processing (preserving the power resource).

It can be seen that, as a rule, these requirements cannot be optimized at the same time but that a meaningful compromise between these requirements must be created by selective software/hardware design of the receiver.

A modern method of error protection coding is the so-called "turbo coding". In turbo coding, so-called "turbo codes" are used. Turbo codes are binary recursive convolution codes that are concatenated in parallel. Turbo codes represent a decidedly effective form of error protection coding, particularly in the transmission of large data blocks.

In the receiver, a turbo decoder is used for decoding turbo codes. Such a decoder is described on pages 343 to 368, particularly FIG. E.2, of the book "Analyse und Entwurf digitaler Mobilfunksysteme" [Analysis and design of digital mobile radio systems] by P. Jung, Stuttgart, B. G. Teubner, 1997. That turbo decoder consists of two recursively interconnected MAP symbol estimators between which a turbo code interleaver is arranged. The turbo decoding takes place iteratively in that the data signal to be decoded passes several times through a computing loop which contains the computing steps first symbol estimation—interleaving—second symbol estimation—deinterleaving.

An obstacle in the implementation of turbo codes is that turbo decoders require considerable signal processing and hardware expenditure due to the iterative signal processing and the two MAP symbol estimators.

For this reason turbo codes have hitherto only been used in systems less restricted in resources such as, for example, satellite communication systems. In the field of mobile radio, turbo codes are not yet used due to the the restrictions. However, the UMTS (Universal Mobile Telecommunications Systems) standard already includes the possibility of turbo coding.

SUMMARY OF THE INVENTION

It is accordingly an object of the invention to provide a turbo decoder and a method for decoding a turbo code which overcome the above-mentioned disadvantages of the heretofore-known devices and methods of this general type and which, with supportable hardware expenditure, provides for signal decoding that involves little signal processing and thus saves energy resources. In particular, the turbo decoder according to the invention and the turbo decoding method according to the invention are intended to enable turbo codes to be implemented in the field of mobile radio.

With the foregoing and other objects in view there is provided, in accordance with the invention, a turbo decoder assembly for decoding a data signal error-protection-coded with a turbo code at a transmitter end, transmitted via a disturbed transmission channel, and received in a receiver, comprising:

a turbo decoder having a first computing device, a second computing device, and a bidirectional interface connected between the first and second computing devices for transferring data between the first and second computing devices, the turbo decoder being configured to iteratively decode a data signal received in the receiver in a computing loop, to be passed a plurality of times, and containing the following computing steps:

(a) first symbol estimation of an input data signal, taking into consideration a first partly redundant data signal and a feedback data signal;

(b) interleaving of the data signal calculated in the first symbol estimation;

(c) second symbol estimation of the interleaved data signal, taking into consideration a second partly redundant data signal; and (d) deinterleaving the data signal calculated in the second symbol estimation, for determining the feedback data signal;

wherein:

the first computing device is configured to carry out steps (a) and (c); and the second computing device is configured to carry out steps (b) and (d).

In other words, the concept of the invention is to enable the computing loop to be processed with greater economy in terms of resources by means of a selective division of the computing steps (already known as such) of a computing loop, which must be passed several times in iterative decoding of a turbo code, over two different computing means. It was found in the invention that the saving of resources which can be achieved by this division overcompensates for the additional expenditure which becomes necessary due to the twice-repeated bidirectional data transfer within a computing loop.

The gain with respect to the hardware resource consists in that only one symbol estimator (first computing means) is needed for the two symbol estimating steps (a) and (c).

The computing steps (a) and (c), which require little memory space and a large computing expenditure, are preferably carried out in a first computing means which is largely or completely constructed of hardware, whereas a separate second computing means, which is preferably a digital signal processor (DSP) processing firmware, is used for processing the computing steps (b) and (d) requiring a large amount of memory space and little computing expenditure. The gain with respect to the energy resource thus consists in that the dividing of the computing steps over two computing means according to the invention can be met by a "hardware/software split" of the overall system.

A further expedient embodiment of the invention is characterized in that, if a calculation of statistical information representative of the instantaneous channel state is carried out in the computing loop, this computing step is carried out by the second computing means.

The first computing means preferably comprises a first hardware computing chip constructed of combinatorial logic for generating transition metric values and/or a second hardware computing chip constructed of combinatorial logic for generating forward and reverse recursion metric values and/or a third hardware computing chip constructed of combinatorial logic for generating output values which are representative of the probability with which a data symbol of the detected data signal, which is to be estimated, has a particular value. Each of said hardware computing chips can produce a selective acceleration of the signal processing in the calculation of the respective values (transition metric values; forward and reverse recursion metric values; output values), i.e. there is no time- and energy-consuming program processing at this point. As a result, the entire turbo decoding sequence can be considerably accelerated.

A further advantageous embodiment of the turbo decoder according to the invention is characterized in that the bidirectional interface is allocated to two DMA (Direct Memory Access) channels. The DMA channels in each case provide for a fast data transfer between the two computing means and due to the fact that two DMA channels are used, it is possible to design each DMA channel for different data formats.

With the above and other objects in view there is also provided, in accordance with the invention, a method for turbo decoding a data signal error-protection-coded at a transmitter end, transmitted via a disturbed channel, and detected in a receiver. The method comprises:

iteratively decoding the data signal detected in the receiver in a computing loop, to be passed several times and containing the following computing steps:

(a) first symbol estimation of an input data signal, taking into consideration a first partly redundant data signal and a feedback data signal, (b) interleaving of the data signal calculated in the first symbol estimation, (c) second symbol estimation of the interleaved data signal, taking into consideration a second partly redundant data signal, and (d) deinterleaving the data signal calculated in the second symbol estimation, for determining the feedback data signal;

and thereby computing steps (a) and (c) in a first computing device and computing steps (b) and (d) in a second computing device; and performing within one computing loop pass, two bidirectional data transfer operations between the first and second computing devices.

Other features which are considered as characteristic for the invention are set forth in the appended claims.

Although the invention is illustrated and described herein as embodied in a Turbo decoder and turbo decoding method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8A is an illustration in which the possible transitions between start and end states of a turbo coder when a bit of value 0 is input are shown;

FIG. 8B is an illustration in which the possible transitions between the starting and end states of a turbo coder when a bit of value 1 is input are shown;

FIG. 8C is an illustration in which four groups of transitions are shown ordered in accordance with the end states;

FIG. 8D is a block diagram of a computing stage for calculating theoretic information of a turbo code.

DESCRIPTION OF THE PREFERRED EMBODIMENTS

Figure 1:
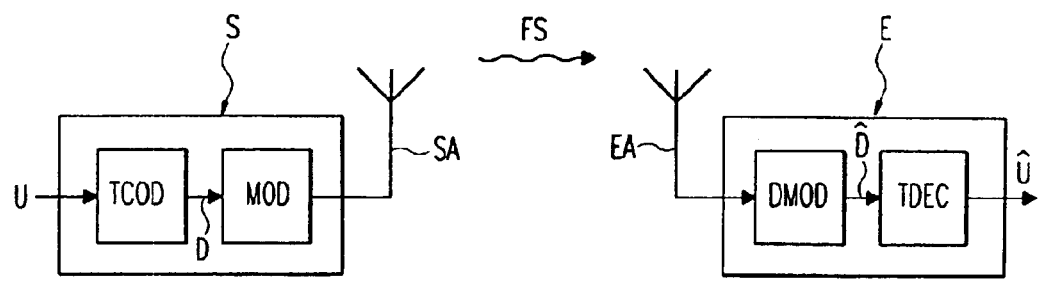
FIG. 1 is a diagrammatic representation of the air interface of a mobile radio system with transmitter and receiver.

Referring now to the figures of the drawing in detail and first, particularly, to FIG. 1 thereof, there is shown a transmitter S and a receiver E of a mobile radio system. The transmitter S is contained, for example, in a base station of the mobile radio system and the receiver E is contained in a mobile station of the mobile radio system.

The transmitter S has a turbo coder TCOD, a modulator MOD, and a transmitting antenna SA.

The turbo coder TCOD receives a digital input signal in the form of data symbols (for example bits) $u_1, u_2, \ldots$. In the following, we will consider a finite sequence $U=(u_1, u_2, \ldots, u_N)$ consisting of N input signal data symbols (e.g. bits) $u_n$, $n=1, 2, \ldots, N$, subject to block-by-block coding. The number N is designated as block size.

The input signal carries user information to be transmitted, for example a voice message. It can be generated, e.g. via a chain of microphone-amplifier-analog/digital converter circuits.

The turbo coder TCOD adds redundancy to the digital input signal for the purpose of error protection coding. At the output of the turbo coder TCOD, an error-protection-coded data signal is present in the form of a sequence D consisting of K data symbols (bits), $D=(d_1, d_2, \ldots, d_K)$.

The ratio N/K (number of input bits/number of output bits) is called the code rate $R_c$ of a coder.

The error-protection-coded data signal is modulated onto a carrier signal by a modulator MOD. The carrier signal modulated with the error-protection-coded data signal is spectrally shaped by a transmit filter in a manner not shown and is amplified by a transmit amplifier before it is radiated as radio signal FS via the transmitter antenna SA.

The receiver E has a receiving antenna EA, a demodulator DMOD and a turbo decoder TDEC.

The receiving antenna EA receives the radio signal FS, which is disturbed by environmental influences and interference with radio signals of other subscribers, and supplies it to the demodulator DMOD.

The demodulator DMOD equalizes the received radio signal FS, taking into consideration the signal disturbances suffered in the radio channel. An equalized data signal provided at the output of the demodulator DMOD is available in the form of a data symbol sequence $\hat{D}=(\hat{d}_1, \hat{d}_2, \ldots, \hat{d}_K)$, the elements $\hat{d}_1, \hat{d}_2, \ldots, \hat{d}_K$ of which are value-continuous estimates of the data symbols $d_1, d_2, \ldots, d_K$ of the error-protection-coded data symbol sequence D.

The equalized data signal is supplied to the turbo decoder TDEC, at the output of which a decoded output signal sequence $\hat{U}=(\hat{u}_1, \hat{u}_2, \ldots, \hat{u}_N)$ is provided. The elements $\hat{u}_1, \hat{u}_2, \ldots \hat{u}_N$ of the decoded output signal sequence $\hat{U}$ are hypotheses of the data symbols $u_1, u_2, \ldots u_N$ of the input signal at the transmitter end in the form of discrete values from the set of symbols (for example 0,1) of the input signal.

The data symbol error rate is defined by the relative frequency of estimation errors $u_n \neq \hat{u}_n$, $n=1, 2, \ldots$. It must not exceed a particular maximum permissible value in mobile radio applications.

Figure 2:
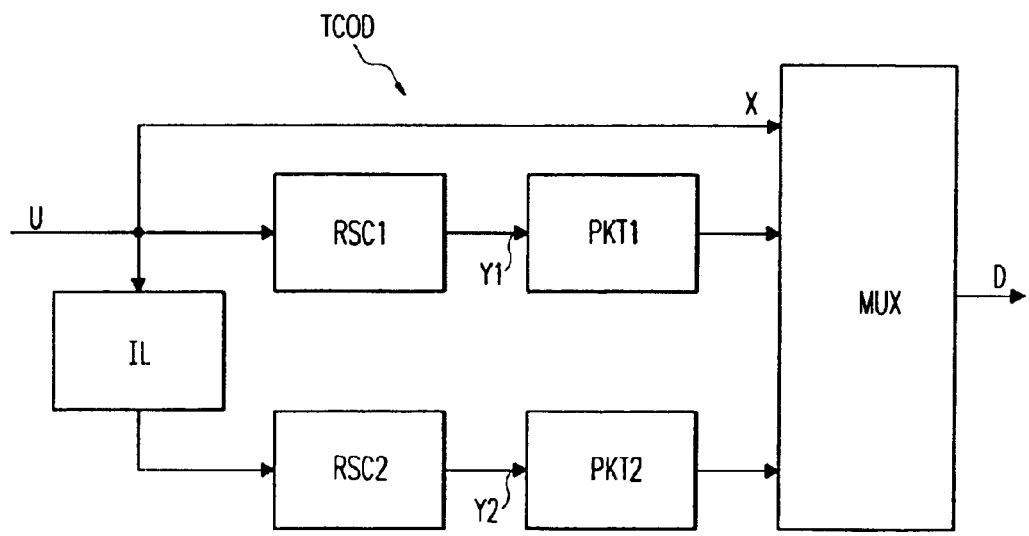
FIG. 2 is a block diagram of a turbo coder for generating a turbo code.

Before describing an exemplary embodiment of the turbo decoder according to the invention, the generation of a turbo code is first explained by way of an example with reference to FIG. 2 to provide a better understanding of the invention.

A turbo coder TCOD has two identical binary recursive systematic convolution coders RSC1 and RSC2 which are known as RSC (Recursive Systematic Convolutional) coders in the coding technology. The input of the second RSC convolutional coder RSC2 is preceded by a turbo code interleaver IL which interleaves the input data signal block by block. The outputs of the two convolutional coders RSC1 and RSC2 are in each case connected to a multiplexer device MUX via puncturing devices PKT1 and PKT2, respectively. The multiplexer device MUX is also supplied with a signal sequence X which is identical with the digital input signal sequence U.

Figure 3:
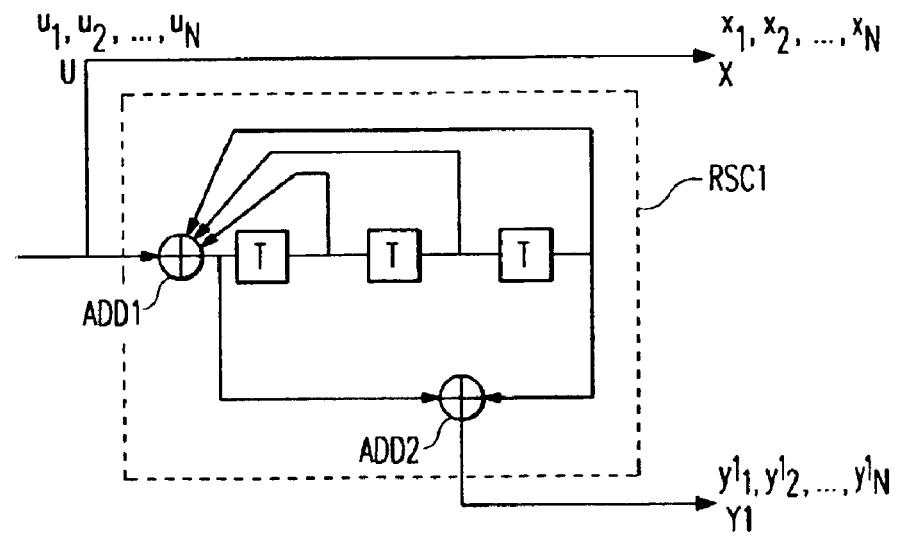
FIG. 3 is a block diagram of an RSC convolution coder shown in FIG. 2.

FIG. 3 shows the configuration of a recursive convolutional coder with the example of RSC1. The convolutional coder RSC1 has at its input a first adder ADD1 and a shift register, following the first adder ADD1, with, say, three storage cells T. The convolutional coder RSC1 provides at its output a redundant data sequence $Y1=(y1_1, y1_2, \ldots, y1_N)$ which is formed by a second adder ADD2.

It becomes clear that a redundant data symbol $y1_n$ ($n=1, 2, \ldots, N$) that is present at the output at a particular time n depends on the current input data symbol $u_n$ of the input signal sequence U and on the state of the shift register.

The configuration of the second convolutional coder RSC2 is identical to the configuration of the first convolutional coder RSC1; RSC2 provides at its output a redundant data sequence $Y2=(y2_1, y2_2, \ldots, y2_N)$.

The signal sequence X can be considered as the second output of the first convolutional coder RSC1, that is to say, when looking at it in this way, the first convolutional coder RSC1 comprises a second output at which the data sequence X is output, the elements $x_1, x_2, \ldots, x_N$ of which are identical with the elements $u_1, u_2, \ldots u_N$ of the input signal sequence U. This analogously applies to the second convolutional coder RSC2 and a second output X_I (not illustrated) of this coder which is identical with the interleaved input signal sequence U. Coders having this characteristic are called systematic coders.

For each input data symbol $u_n$, each convolutional coder RSC1 and RSC2, respectively, then outputs exactly two output data symbols $x_n$ and $y1_n$ and, respectively, $x\_I_n$ (interleaved systematic information) and $y2_n$. Each convolutional coder RSC1, RSC2 thus has a code rate $R_c=0.5$.

The multiplexer device MUX is used for adjusting the code rate of the turbo coder TCOD. To achieve a code rate of, for example, $R_c=0.5$ also for the turbo coder TCOD, the two redundant part-sequences Y1 and Y2 are, for example, alternatively punctured and multiplexed. The resultant redundant data sequence $Y=(y1_1, y2_2, y1_3, y2_4, \ldots, y1_N, y2_N)$ is then alternately multiplexed with the systematic data sequence X. The error-protection-coded data signal resulting from this (special) form of turbo coding accordingly has, for example, the form $D=(x_1, y1_1, x_2, y2_2, x_3, y1_3, x_4, y2_4, \ldots, x_N, y2_N)$ (N is assumed to be an even number).

The convolutional coder RSC1 can be considered as a finite clocked state machine and described by a so-called trellis diagram having M possible states. The trellis diagram of the convolutional coder RSC1 with a shift register of 3 cells has $M=2^3=8$ nodes which correspond to the possible states of the shift register. An (arbitrary) first state m', which changes into a second state m by inputting an input bit ($u_n=0$ or 1) is connected to it by a connecting line in the trellis diagram. Each redundant part-sequence Y1 corresponds to a particular path along connecting lines through the trellis diagram of the RSC1 coder.

Trellis diagrams for illustrating the states of coders are known and will not be explained in greater detail here.

Figure 4:
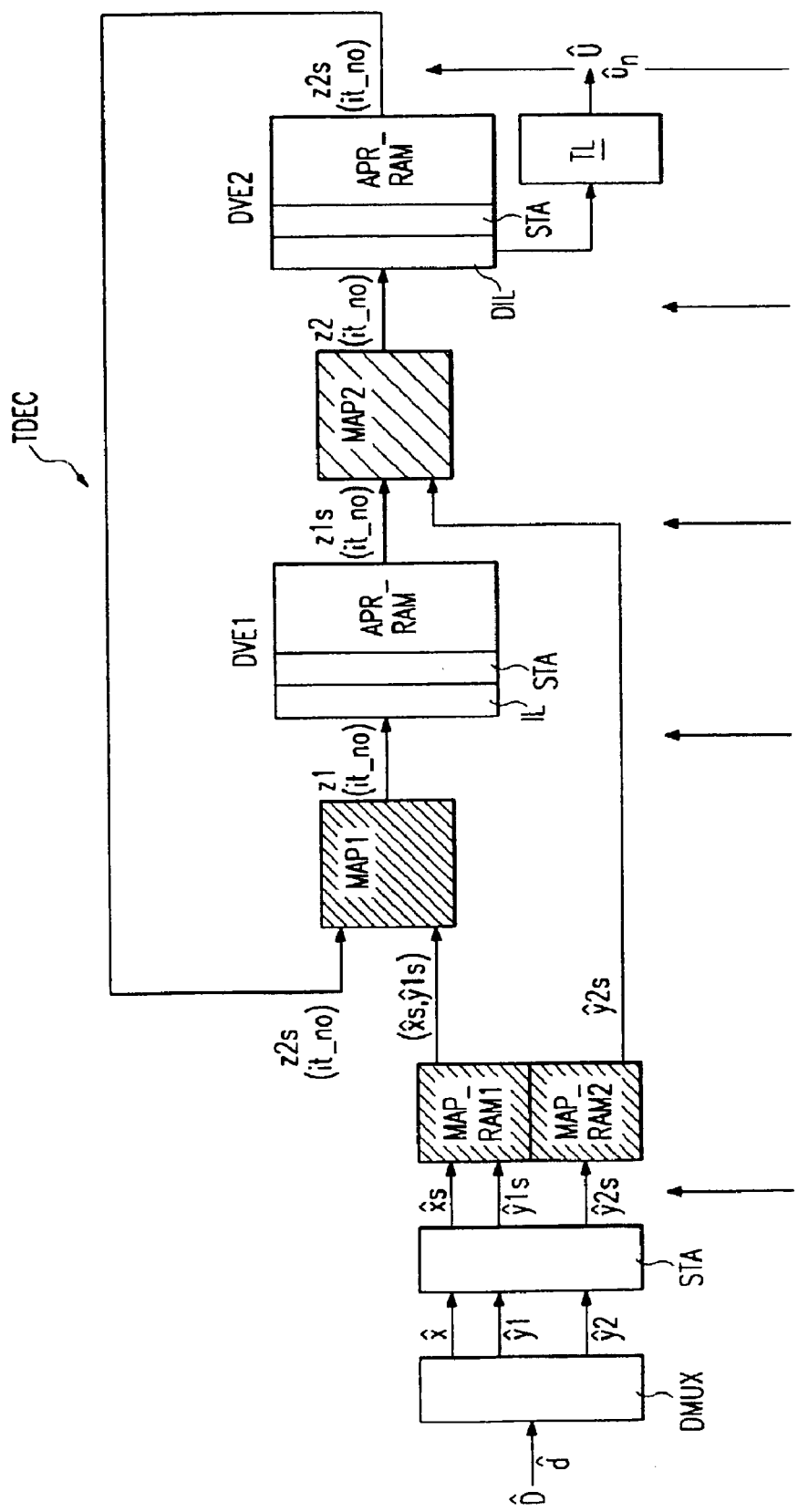
FIG. 4 is a functional block diagram for explaining the operation of a turbo decoder according to the invention.

FIG. 4 shows a block diagram for explaining the operation of an exemplary embodiment of a turbo decoder TDEC according to the invention.

The turbo decoder TDEC comprises a demultiplexer DMUX, a statistics stage STA, a first and second random access memory MAP_RAM1, MAP_RAM2, a first and second MAP symbol estimator MAP1 and MAP2, a first and second data processing unit DVE1, DVE2 and a decision logic (threshold decider) TL.

The first data processing unit DVE1 comprises a turbo interleaver IL, a statistics stage STA and a data memory APR_RAM. The second data processing unit DVE2 comprises a deinterleaver DIL, also a statistics stage STA and also a data memory APR_RAM.

The equalized data sequence $\hat{D}=(\hat{x}_1, \hat{y}1_1, \hat{x}_2, \hat{y}2_2, \hat{x}_3, \hat{y}1_3, \hat{x}_4, \hat{y}2_4, \ldots, \hat{x}_N, \hat{y}2_N)$ supplied to the turbo decoder TDEC from the demodulator DMOD is split by the demultiplexer DMUX provided at the input end into the equalized systematic data sequence $\hat{X}$ (detected version of the input signal sequence U (=X)) and the two equalized redundant part-sequences $\hat{Y}1$ and $\hat{Y}2$ (detected versions of the redundant part-sequences Y1 and Y2). The equalized (estimated) versions of the data symbols $x_n$, $y1_n$, $y2_n$ occurring at the transmitter end are designated by $\hat{x}_n$, $\hat{y}1_n$, $\hat{y}2_n$ (n=1, 2, ..., N). (In the drawing, the indices n of the respective subsequent elements have been omitted for reasons of clarity).

The data symbols $\hat{x}_n$ (systematic information) and $\hat{y}1_n$, $\hat{y}2_n$ (redundant information) are supplied to the statistics stage STA. On the basis of the knowledge of the instantaneous state of the transmission channel, the statistical data values $\hat{x}s_n$, $\hat{y}1s_n$, $\hat{y}2s_n$ are calculated there in accordance with the following equations:

$$\hat{x}s_n = \hat{x}_n \cdot \mu_{\hat{x}n}/\sigma_{\hat{x}n}^2$$
$$\hat{y}1s_n = \hat{y}1_n \cdot \mu_{\hat{y}1n}/\sigma_{\hat{y}1n}^2$$
$$\hat{y}2s_n = \hat{y}2_n \cdot \mu_{\hat{y}2n}/\sigma_{\hat{y}2n}^2 \quad (1)$$

where $\mu_{\hat{x}}n$, $\mu_{\hat{y}}1n$, $\mu_{\hat{y}}2n$ designate the mean values and $\sigma_{\hat{x}}n^2$, $\sigma_{\hat{y}}1n^2$, $\sigma_{\hat{y}}2n^2$ designate the variances of the white noise with respect to the associated signal components.

The statistical data symbol values $\hat{x}s_n$ and $\hat{y}1s_n$ are stored in the data memory MAP_RAM1 and the statistical data values $\hat{y}2s_n$ are stored in the data memory MAP_RAM2. The memory sizes of MAP_RAM1 and MAP_RAM2 are in each case dimensioned such that the statistical data values of an entire block (e.g. N=5120) can be accommodated.

Iterative turbo decoding is performed on the basis of the systematic information $\hat{x}s_n$, which is representative of a datablock, and redundant information $\hat{y}1s_n$ and $\hat{y}2s_n$. The iteration loop is formed in a manner known per se (see the book by P. Jung mentioned at the outset) by the units MAP1, DVE1, MAP2, DVE2 and the return of feedback information $z2s_n$ from DVE2 to MAP1.

More precisely, the first MAP symbol estimator MAP1 calculates a first sequence of value-continuous logarithmic first reliability information $z1_n$ (it_no=1) on the basis of the input data values $\hat{x}s_n$ and $\hat{y}1s_n$ and an initial feedback information item $z2s_n$ (it_no=0) in a first iteration step (it_no=1). This first iteration sequence of logarithmic reliability information is interleaved in the turbo interleaver IL and statistically edited in the statistic stage STA. Statistical editing occurs in accordance with the following equation:

$$z1s_n = z1_n \cdot \mu_{z1n}/\sigma_{z1n}^2 \quad (2)$$

where $\mu_{z1n}$ designates the mean value and $\sigma_{z1n}^2$ designates the variance of the white noise of the first reliability information $z1_n$.

To carry out the said procedures (interleaving and statistical editing), the subsequent values $z1s_x$ (it_no=1) are temporarily stored in the random-access data memory APR_RAM of the first data processing unit DVE1.

The data values $z1s_n$ (it_no=1), generated in the first data processing unit DVE1 during the first iteration, of the interleaved sequence of first reliability information (first iteration) are conducted to the second MAP symbol estimator MAP2. The latter calculates from these data values and the sequence $\hat{y}2s_n$ (identical for all iteration passes) a sequence of second logarithmic reliability information $z2_n$ (it_no=1). The individual values of the sequences of first and second reliable information are logarithmic a posteriori probability ratios, so-called LLRs (Log Likelihood Ratios).

The sequence of second reliability information $z2_n$(it_no=1) is supplied to the turbo deinterleaver DIL and the statistic stage STA of the second data processing unit DVE2 and is there deinterleaved and statistically edited. The statistical editing is done in accordance with the following information $$z2s_n = z2_n \cdot \mu_{z2n}/\sigma_{z2n}^2 \quad (3)$$

where $\mu_{z2n}$ designates the mean value and $\sigma_{z2n}^2$ designates the variance of the white noise of the second reliability information $z2_n$.

The random-access data memory APR_RAM is again used for temporarily storing the data values $z2s_n$(it_no=1) generated in the manner described. According to FIG. 4, they are available to the first symbol estimator MAP1 as feedback information during the next iteration pass (it_no=2).

After a predetermined number of, for example, five iteration passes, the data values $z2_n$ (it_no=5) generated at the output of the turbo deinterleaver DIL of the second data processing unit DVE2 are supplied (deinterleaved) to a threshold decider TL. The threshold decider TL determines a reconstructed data symbol $\hat{u}_n=0$ for each element of the specified data sequence having a value $\leq 0$ and a reconstructed data symbol $\hat{u}_n=1$ for each element of said data sequence having a value $>0$.

According to the invention, the first and second symbol estimators MAP1, MAP2 and the first and second data processing units DVE1, DVE2 are implemented in each case in the form of one and the same hardware structure. The arrows drawn in the lower part of FIG. 4 identify the data transfer locations implemented by means of a bidirectional interface, at which a data transfer between a symbol estimator (contains MAP1/2 and the associated memories MAP_RAM1/2, drawn shaded) and a digital signal processor (contains DVE1/2, where appropriate, DMUX, STA, TL, no shading) is made.

It will be understood by those of skill in the art that, in particular, the statistics stage STA can also be constructed in hardware or hardwired, and integrated in the symbol estimator.

Figure 5:
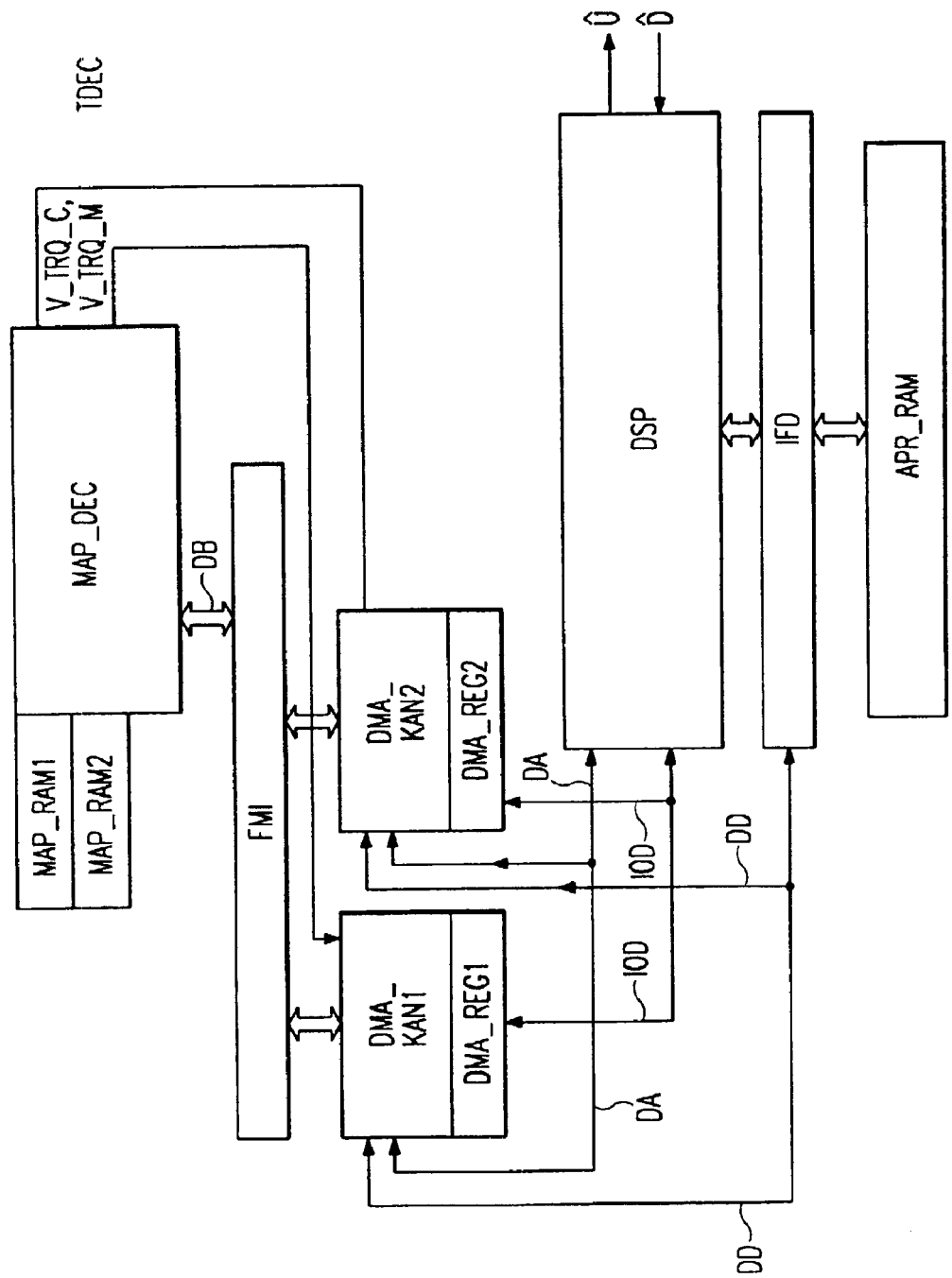
FIG. 5 is a block diagram of the turbo decoder shown in FIG. 4.

FIG. 5 shows a block diagram of the turbo decoder TDEC already described by means of FIG. 4.

The turbo decoder TDEC comprises a MAP decoder MAP_DEC which corresponds to the two symbol estimators MAP1/2 in FIG. 4 and is connected to the two MAP data memories MAP_RAM1 and MAP_RAM2. The MAP decoder MAP_DEC is connected via a bidirectional databus DB and an FMI (flexible memory interface) FMI to two programmable DMA (direct memory access) channels DMA_KAN1 and DMA_KAN2. The "position" of this FMI interface FMI with associated DMA channels DMA_KAN1 and DMA_KAN2 in the turbo decoder sequence is indicated by the arrows as already mentioned in FIG. 4.

The programmable DMA channels DMA_KAN1/2 in each case comprise internal DMA registers DMA_REG1, DMA_REG2. The internal DMA registers DMA_REG1/2 are connected to a digital signal processor DSP via respective programming lines IOD for bidirectional data exchange.

The DSP has access to the data memory APR_RAM via data lines and an internal DSP interface IFD. Furthermore, the DSP and the DSP interface IFD are connected to the DMA channels DMA_KAN1/2 via a bidirectional bus structure consisting of a databus DD and an address bus DA to exchange data.

By processing a software programmed by the manufacturer (Firmware) and temporarily storing data in the data memory APR_RAM, the DSP carries out the statistical calculations and interleaving and deinterleaving procedures (see FIG. 4) and possibly also the data processing steps carried out by the units DMUX and TL.

The data transmission via the DMA channels DMA_KAN1/2 and the FMI interface FMI to the MAP decoder MAP_DEC is initiated via two data request control signals V_TRQ_M (request for data transfer via the first DMA channel DMA_KAN1) and V_TRQ_C (request for data transfer via the second DMA channel DMA_KAN2).

The input data for the first and second symbol estimation (MAP1 and MAP2 mode) are transmitted via the first DMA channel DMA_KAN1. For the first symbol estimation, these are, on the one hand, the statistical data values of the systematic information $\hat{x}s_n$ and the statistical data values of the first redundant information $\hat{y}1s_n$ which only need to be transmitted once at the beginning of a block decoding sequence and, on the other hand, the statistically edited data values $z2s_n$ (it_no) of the feedback information which are transmitted in each iteration pass of the turbo decoding.

In the two tables 1 and 2, a data format, used with a word length of 16 bits, for example, of the input values for the first symbol estimation are shown.

TABLE 1

(data transfer for the first symbol estimation, once per block)

| Bits 0–3 | Bits 4–7 | Bits 8–11 | Bits 12–15 |
|---|---|---|---|
| | $\hat{x}s_1$ | | $\hat{y}1s_1$ |
| | $\hat{x}s_2$ | | $\hat{y}1s_2$ |
| | $\hat{x}s_3$ | | $\hat{y}1s_3$ |
| | ... | | ... |
| | ... | | ... |
| | $\hat{x}s_N$ | | $\hat{y}1s_N$ |

TABLE 2

(data transfer for the first symbol estimation, with each iteration pass)

| Bits 0–3 | Bits 4–7 | Bits 8–11 | Bits 12–15 |
|---|---|---|---|
| | $z2s_1$(it_no=1–5) | | |
| | $z2s2$(it_no=1–5) | | |
| | $z2s3$(it_no=1–5) | | |
| | ... | | |
| | ... | | |
| | $z2sN$(it_no=1–5) | | |

For the second symbol estimation (MAP2 mode), the statistical data values of the second redundant information $\hat{y}2s_n$ and—in each iteration pass—the statistically edited data values of the first reliability information $z1s_n$ (it_no) are fed to the MAP decoder MAP_DEC also via the first DMA channel DMA_KAN1, the bidirectional FMI interface FMI and the databus DB:

TABLE 3

(data transfer for the second symbol estimation, once per block)

| Bits 0–3 | Bits 4–7 | Bits 8–11 | Bits 12–15 |
|---|---|---|---|
| | $\hat{y}2s_1$ | | |
| | $\hat{y}2s_2$ | | |
| | $\hat{y}2s_3$ | | |
| | ... | | |
| | ... | | |
| | $\hat{y}2s_N$ | | |

TABLE 4

(data transfer for the second symbol estimation, with each iteration pass)

| Bits 0–3 | Bits 4–7 | Bits 8–11 | Bits 12–15 |
|---|---|---|---|
| | $z1s1$(it_no=1–5) | | |
| | $z1s2$(it_no=1–5) | | |
| | $z1s3$(it_no=1–5) | | |
| | ... | | |
| | ... | | |
| | $z1s_N$(it_no=1–5) | | |

The second DMA channel DMA_KAN2 is used for transmitting the result values (output data) $z1_n$ and $z2_n$ of the symbol estimators MAP1 and MAP2, respectively, to the DSP.

Figure 6:
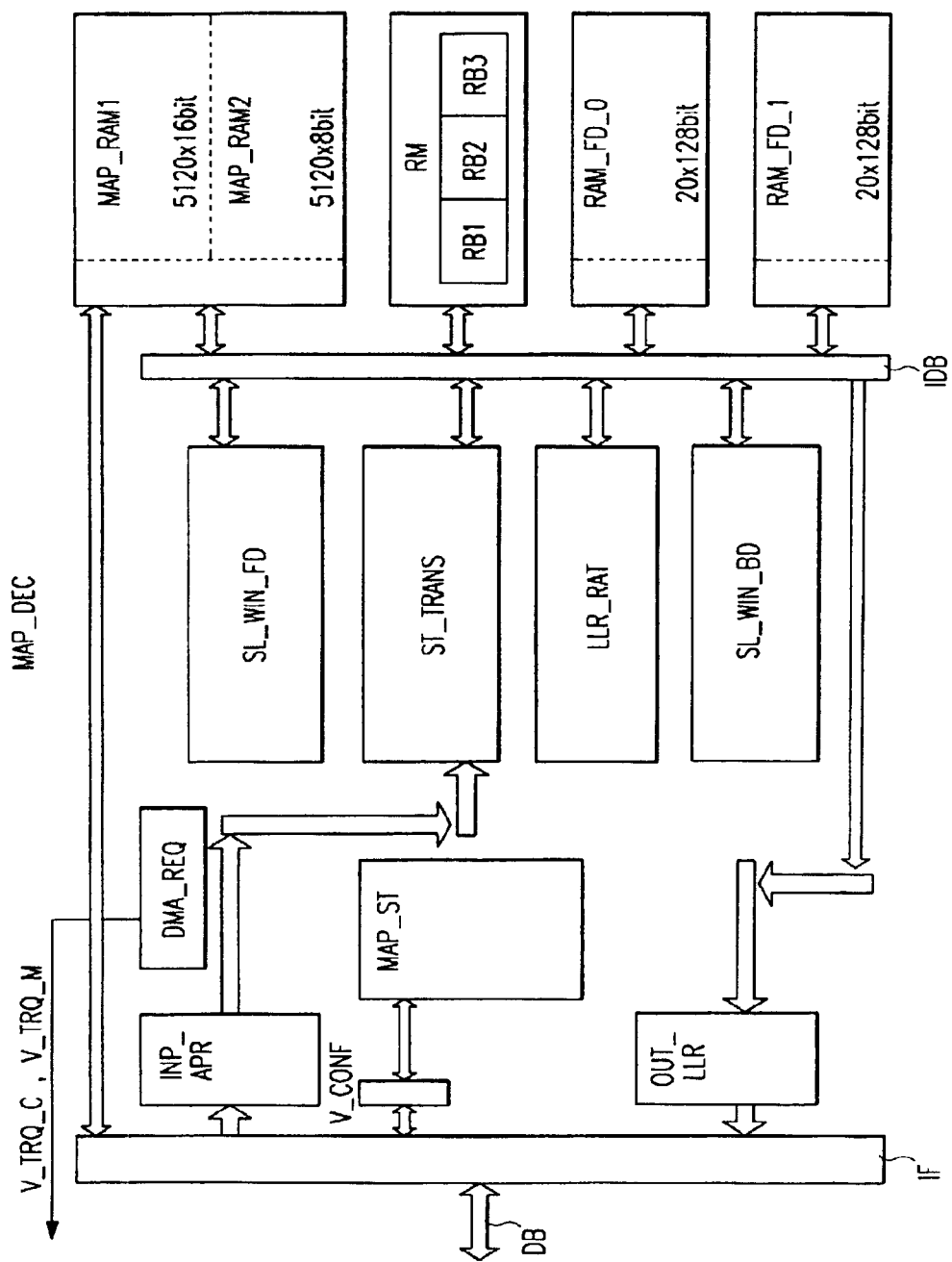
FIG. 6 is a simplified block diagram of the MAP decoder shown in FIG. 5.

FIG. 6 shows a block diagram of the MAP decoder MAP_DEC.

The data transmitted via the databus DB are transferred to an internal interface IF.

In addition to the internal interface IF and the two MAP data memories MAP_RAM1 (e.g. N×16 bits) and MAP_RAM2 (e.g. N×8 bits), the MAP decoder MAP_DEC comprises an input data memory INP_APR, an output data memory OUT_LLR, a configuration register V_CONF, a DMA request unit DMA_REQ for generating the request control signals V_TRQ_C and V_TRQ_M and a module for generating standard-specific code information (trellis information) MAP_ST. Furthermore, the MAP decoder MAP_DEC comprises a control unit ST_TRANS for controlling the calculation of transition metric values, a control unit SL_WIN_FD for controlling the calculation of forward recursion metric values, a control unit SL_WIN_BD for controlling the calculation of reverse recursion metric values and a control unit LLR_RAT for controlling the calculation of values of the first and second reliability information $z1_n$(it_no) and $z2_n$(it_no), respectively. The four control units are connected to a computing means RM comprising three hardware computing chips RB1, RB2, RB3 via an internal databus IDB for exchanging data. Furthermore, it is possible to access two data memories for forward recursion metric values, namely RAM_FD_0 and RAM_FD_1, both with a size of, e.g. 20×128 bits, via the internal databus IDB. RAM_FD_0 contains forward recursion metric values which are generated due to a transition with an input bit of 0. RAM_FD_1 contains forward recursion metric values which are generated due to a transition with an input bit of 1.

Figure 7:
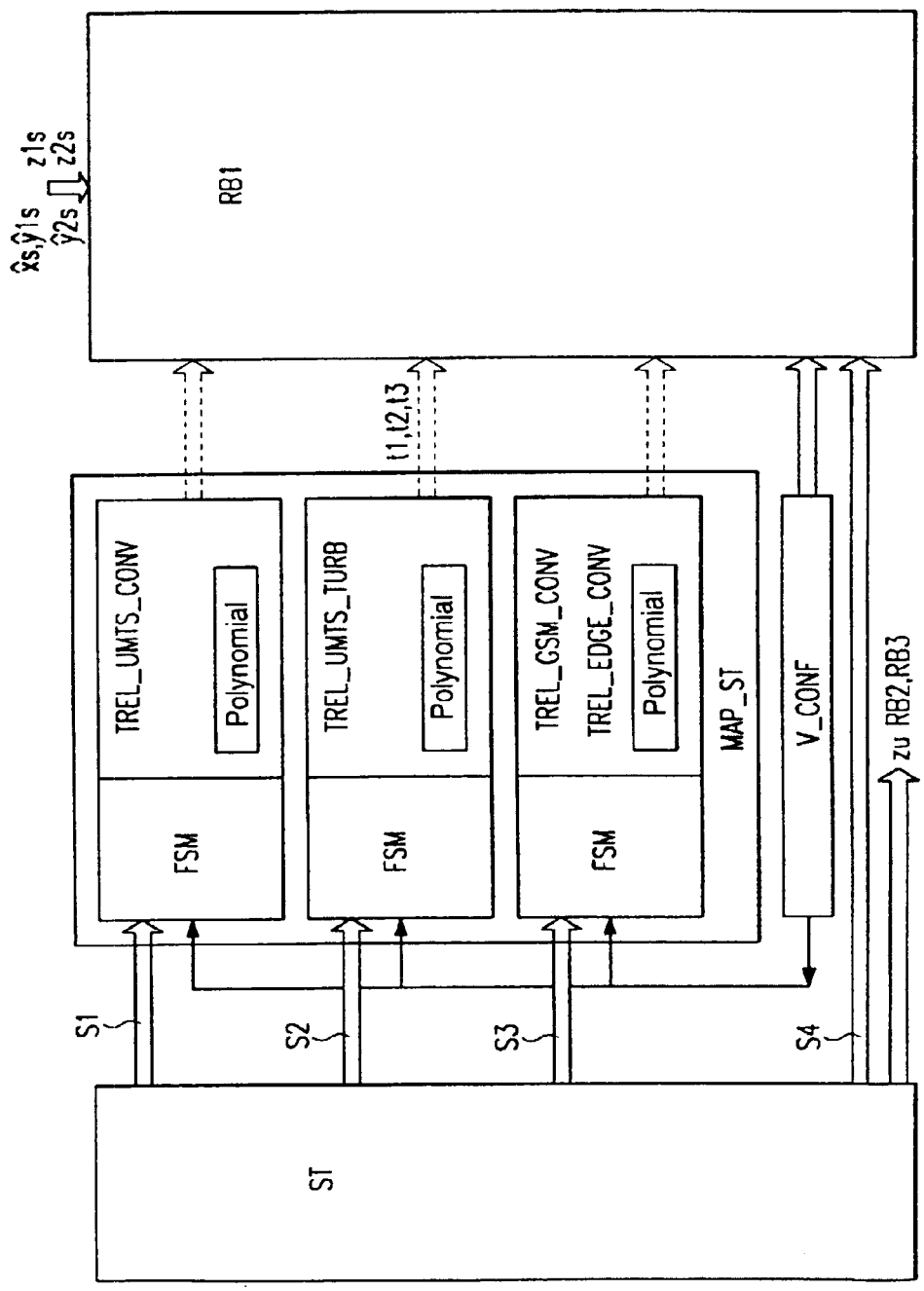
FIG. 7 is a block diagram of the control unit, shown in FIG. 6, for generating standard-specific code information.

The MAP decoder shown in FIG. 6 operates as follows:

During an initialization process, the MAP decoder MAP_DEC is first informed via the databus DB about which code forms the basis of the coding of the data signal to be transmitted at the transmitter end. According to the invention, the available codes include at least one turbo code. In accordance with the basic code, code-specific input data values are generated for the first computing chip RB1 in the module MAP_ST. This will still be explained in greater detail in conjunction with FIG. 7.

To decode an entire datablock, the data values $\hat{x}s_n$, $\hat{y}1s_n$ and $\hat{y}2s_n$ of the systematic information (already statistically edited in the DSP) and of the first and second redundant information for a datablock (n=1, ..., N) are first loaded into the data memories MAP_RAM1/2.

In a first computing step, the MAP decoder MAP_DEC carries out a first symbol estimation (MAP1 mode). On the basis of the memory content of MAP_RAM1 and of the initial feedback information $z2s_n(it\_no=0)$, transition metric values are generated in the first computing chip RB1 under the control of the control unit ST_TRANS, forward and reverse recursion metric values are generated in the computing chip RB2 under the control of the control units SL_WIN_FD and SL_WIN_BD and the logarithmic values of the first reliability information with regard to the first iteration pass $z1_n(it\_no=1)$ are generated by means of the third computing chip RB3 under the control of the control unit LLR_RAT. These values are supplied to the DSP via the output data memory OUT_LLR, the internal interface IF and the databus DB.

As already described by means of FIG. 4, the (interleaved and statistically edited) data values $z1s_n(it\_no=1)$, generated by the DSP, are returned to the MAP decoder MAP_DEC after request by means of the control signal V_TRQ_C and initially temporarily stored in the input data memory INP_APR.

The MAP decoder MAP_DEC then carries out a second symbol estimation (MAP2 mode), i.e. the calculation procedure described above is now carried out on the basis of the data values ($\hat{y}2s_n$) stored in the second MAP data memory MAP_RAM2 and the values temporarily stored in the input data memory INP_APR. The values of the second reliability information $z2_n(it\_no=1)$ are once more output via the output data memory OUT_LLR.

In the text which follows, the calculation of the LLRs by means of forward and reverse recursion is explained briefly with reference to the calculation of the first reliability information $z1_n$.

Each value $z1_n$ is a value-continuous logarithmic probability ratio for the uncoded data symbol $u_n$ of the input signal sequence U, $$z1_n = \ln\left\{\frac{P(u_n = 1 | \hat{X}, \hat{Y}1, Z2)}{P(u_n = 0 | \hat{X}, \hat{Y}1, Z2)}\right\} \quad (4)$$

where $P(u_n=1|\hat{X}, \hat{Y}1, Z2)$ and $P(u_n=0|\hat{X}, \hat{Y}1, Z2)$ designate the conditional probabilities for the data symbol $u_n$ being equal to 1 or equal to 0, respectively, with the condition that the sequences $\hat{X}, \hat{Y}1, Z2$ are observed. These conditional probabilities are a posteriori probabilities since from an event which has occurred (the "measured" sequences $\hat{X}, \hat{Y}1, Z2$), the probabilities of the uncoded data symbols $u_1$ to $u_N$ forming the basis of this event are inferred.

The state of the convolutional coder RSC1 at the transmitter end at time n (i.e. at the input data symbol $u_n$) is designated by $S_n$.

The conditional a posteriori probabilities in equation (4) can be expressed as sums of individual a posteriori probabilities over the $M=2^{L-1}$ possible states $S_n=0, 1, \ldots, M-1$ of the coder RSC1, L designating the depth to which the turbo code generated reaches back:

$$z1_n = \ln\left\{\frac{\sum_{m=0}^{M-1} P(u_n = 1, S_n = m | \hat{X}, \hat{Y}1, Z2)}{\sum_{m=0}^{M-1} P(u_n = 0, S_n = m | \hat{X}, \hat{Y}1, Z2)}\right\} \quad (5)$$

The individual probabilities can be written in the following form:

$$P(u_n=i, S_n=m|\hat{X}, \hat{Y}1, Z2)=\alpha_n^i(m)\cdot\beta_n(m) \quad i=0, 1$$

where $$\alpha_n^i(m)=P(u_n=i, S_n=m|R_1^N)$$

$$\beta_n(m) = \frac{p(R_{n+1}^N | S_n = m)}{p(R_{n+1}^N | R_1^N)} \quad (6)$$

where the sequence $$R_v^\mu=(R_v, \ldots, R_\mu), \quad 1 \leq v < \mu \leq N \quad (7)$$

consisting of the value triples $R_n=(\hat{x}_n, \hat{y}1_n, z2_n)$ of systematic information, redundant information and feedback information is defined in order to simplify the notation.

The expressions $\alpha_n^i(m)$ and $\beta_n(m)$ are called forward recursion and reverse recursion metrics since they can be determined recursively, assuming that the transition metric values $\gamma_n^i(R_n, m', m)$ are known. The transition metric values $\gamma_n^i(R_n, m', m)$ are the probabilities of transition from a first state $S_{n-1}=m'$ to a second state $S_n=m$ of the coder RSC1 and the trellis diagram, i.e.

$$\gamma_n^i(R_n, m', m)=P(u_n=i, S_n=m, R_n|S_{n-1}=m') \quad (8)$$

A detailed description of the recursions (when using an (optimum) MAP symbol estimation) is provided in the chapter E.3.3 "Rekursive MAP-Symbolschätzung" (Recursive MAP symbol estimation) in the above-mentioned book by P. Jung on pages 353–361. The pertinent information in the publication is herewith incorporated by reference.

The recursions may run over the entire block, i.e. the forward recursion begins at time n=1 (first bit of sequences $\hat{X}, \hat{Y}1, Z2$: MAP1, and of sequences $\hat{Y}2, Z1$: MAP2, respectively) and ends at time n=N (last bit of sequences $\hat{X}, \hat{Y}1, Z2$: MAP1, and of sequences $\hat{Y}2, Z1$: MAP2, respectively) and the reverse recursion begins at time n=N and ends at time n=1. Another possibility consists in performing in each case a number of segment-by-segment forward and reverse recursions which gradually cover the entire block (both in the forward direction and in the reverse direction).

In the text which follows, the approximate calculation of the transition metric values, of the forward and reverse recursion metric values and of the LLRs in the MAP decoder MAP_DEC (first computing means) are explained in greater detail with reference to FIGS. 7, 8A–8D, and 9.

The module MAP_ST comprises three submodules TREL_UMTS_CONV, TREL_UMTS_TURB and TREL_GSM_CONV/-TREL_EDGE_CONV. All submodules contain their own state generator FSM.

A control unit ST is used for controlling the timing of and coordinating the state generators FSM and the computing chips RB1, RB2, RB3. For this purpose, the control unit ST is connected via control data lines S1, S2 and S3 to the state generators FSM of the submodules TREL_UMTS_CONV, TREL_UMTS_TURB, TREL_GSM_CONV/TREL_EDGE_CONV and also controls the first computing chip RB1 via a further control data line S4. Other control data lines lead to the other computing chips RB2, RB3.

Each submodule of MAP_ST calculates theoretical information (also designated as trellis information) which is characteristic of a particular code. The theoretical information is in each case calculated on the basis of a code-specific polynomial. The values of the theoretical information calculated in the submodules TREL_GSM_CONV and TREL_EDGE_CONV are based on the GSM (global system for mobile communication) and EDGE (Enhanced Data services for GSM Evolution) standards. The theoretical values t1, t2, t3 calculated by the submodule TREL_UMTS_TURB are based on the UMTS (Universal Mobile Telecommunications System) standard for turbo decoding.

In the following text we will consider only the case of the selection of the submodule TREL_UMTS_TURB by means of V_CONF.

In UMTS, a turbo code with the reversion depth of L=4 is provided. In consequence, the shift register of the convolutional coder RSC1 in the turbo coder (see FIG. 3) can assume precisely 8 states, namely 000, 001, 010, ... etc. In FIGS. 8A and 8B, each of these 8 possible states is shown by means of a box numbered continuously with the index numbers m=0 to 7.

FIG. 8A shows the state transitions m' to m, which occur when the turbo coder, which is initially in an (arbitrary) initial state (at step k−1), is brought into a subsequent state (at step k) by adding an input bit $a_k$ of value 0 (i.e. i=0). A corresponding illustration which shows the state transitions occurring when an input bit $a_k$ of value 1 is added (i.e. i=1) is shown in FIG. 8B.

For each possible state transition (from k−1 to k), three theoretical values t1(i), t2(i), t3(i) are calculated.

The values t1(i) and t3(i) are identical with the added input bit $a_k$ (i.e. t1(i)=t3(i)=i). The value t2 is calculated by the code-specific polynomial.

FIG. 8D shows a possible computing circuit for the value t2 from $a_k$. The computing circuit comprises a shift register consisting of three memory cells T and four adders ADD which are arranged in the circuit in the manner shown. The shift register is occupied with an initial state (e.g. m'=0, i.e. (000)) by the state generator FSM and supplied with an input bit $a_k$. When the input bit $a_k$=i is added, the values t2(i), i=0, 1 referred to the respective initial state, e.g. m'=0, are generated. This process is carried out for all initial states of the shift register.

Figure 9:
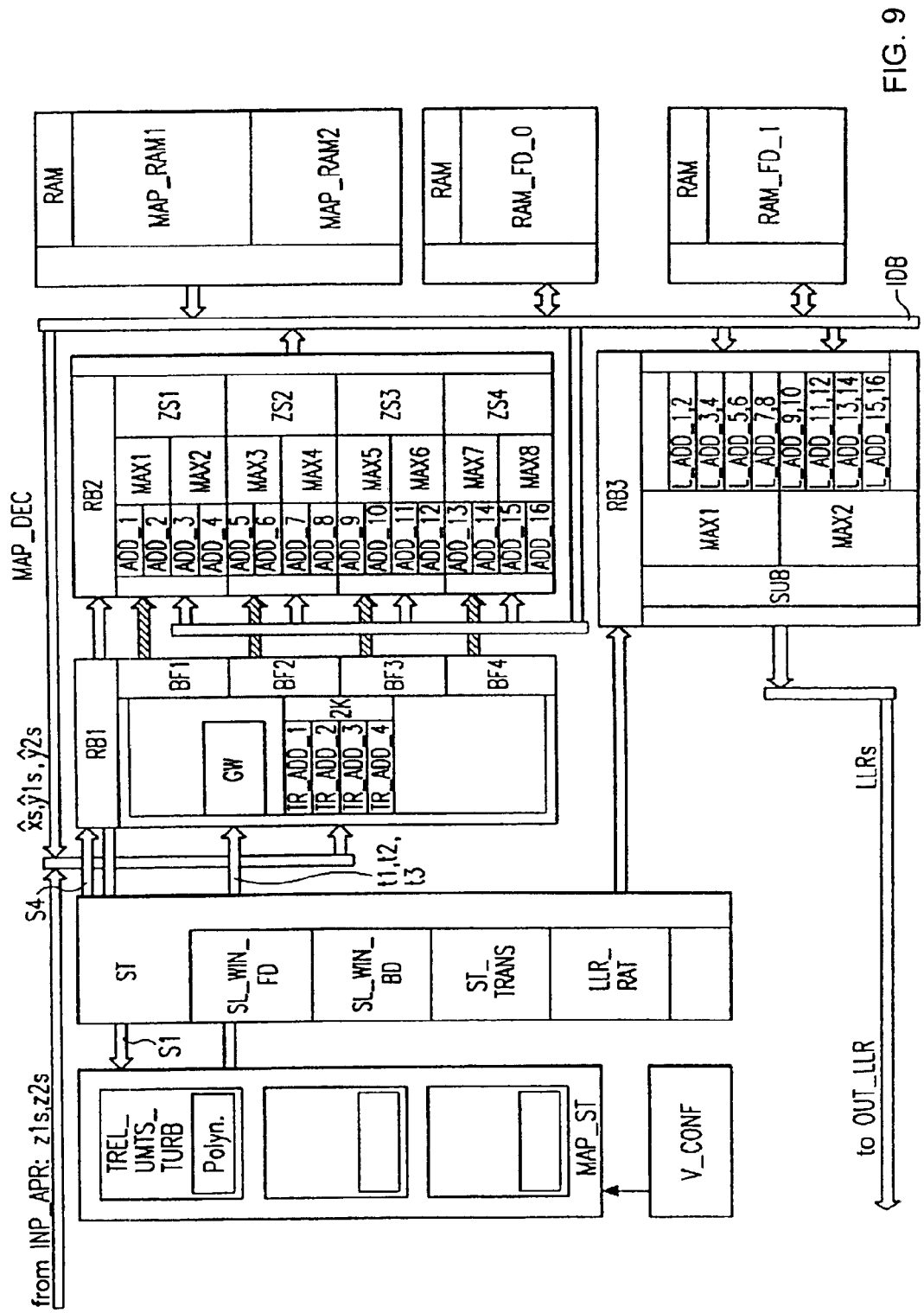
FIG. 9 is a block diagram of the hardware architecture of the MAP decoder shown in FIG. 6.

In the text which follows, the configuration of the computing chips RB1, RB2 and RB3 is explained with reference to FIG. 9. The computing chips RB1, RB2, RB3 are fast data paths which are completely built of combinatorial logic.

The first computing chip RB1 provided for calculating the transition metric values $\gamma_n^i(R_n, m', m)$ receives the theoretical values t1(i), t2(i), t3(i) generated for $a_k$=i, i=0, 1, and converts them into weight factors w1(i), w2(i), w3(i) in a circuit GW. The weight factors w1(i), w2(i), w3(i) are calculated as follows:

$$w1(i)=1-2\cdot t1(i)$$
$$w2(i)=1-2\cdot t2(i)$$
$$w3(i)=1-2\cdot t3(i) \qquad (9)$$

The weight factors w1(i), w2(i), w3(i) are sign values, i.e. +1, −1. Using these sign values, the transition metric values $\gamma_n^i(R_n, m', m)$ are then calculated by multiplication with the "measured values".

In the first symbol estimation (MAP1 mode), $\hat{x}s_n$, $\hat{y}1s_n$ are available as measurement values and $z2s_n(it\_no)$ is available as feedback information. The transition metric of a particular one of the total of 16 transitions (see FIG. 8A and 8B) is calculated in accordance with the following equation:

$$\gamma_n^i(R_n, m', m)=w1(i)\cdot \hat{x}s_n+w2(i)\cdot \hat{y}1s_n+w3(i)\cdot z2s_n(it\_no) \qquad (10)$$

Since w1(i), w2(i), w3(i) are sign values, $\gamma_n^i(R_n, m', m)$ can assume a maximum of 8 different values. Since these values are symmetric to 0, only 4 values and their respective negated values need to be calculated.

These calculations are carried out in parallel, i.e. simultaneously with 4 adders TR_ADD_1, TR-ADD_2, ..., TR_ADD_4 (each of which has three inputs according to eq. (10)), and the subsequent twos complement stage 2K in RB1. The twos complement stage 2K forms the corresponding negated value for a calculated value.

The twos complement stage 2K is followed by a demultiplexer (not shown). This distributes the 8 calculated transition metric values $\gamma_n^i(R_n, m', m)$ to 4 memories BF1, BF2, ..., BF4 with in each case 4 storage locations.

The distribution is carried out in such a manner that in each memory BF1–4, the transition metric values $\gamma_n^i(R_n, m', m)$ of a butterfly are stored. A butterfly is a group consisting of 4 particular transition metric values $\gamma_n^i(R_n, m', m)$. In FIG. 8c, the 4 butterflies are shown. The first butterfly B1 comprises the 4 transition metric values which lead to the end states 0 and 1, the second butterfly B2 comprises the 4 transition metric values which lead to the end states 2 and 3, ..., and the fourth butterfly B4 comprises the 4 transition metric values which lead to the end states 6 and 7.

In the second symbol estimation (MAP2 mode), only two "measurement values" $\hat{y}2s_n$ and $z1s_n$ (it_no) are available. The transition metric value of a particular one of the total of 16 transitions are calculated in accordance with the following equation:

$$\gamma_n^i(G_n, m', m)=w2(i)\cdot \hat{y}2s_n+w3(i)\cdot z1s_n(it\_no) \qquad (11)$$

(where $G_n$ designates the sequence consisting of the value pairs $(z1_n, \hat{y}2_n)$).

Since only two sign values w2(i), w3(i) need to be taken into consideration, $\gamma_n^i(G_n, m', m)$ can assume a maximum of 4 different values. These values can be calculated either directly by the 4 adders TR_ADD_1–4 or by 2 adders and the subsequent twos complement stage 2K.

The further processing path corresponds to that of the MAP1 mode.

The computing chip RB1 is controlled by the control unit ST_TRANS for combining the theoretical values (or the weight factors, respectively) with the "measurement values" according to equations (10) and (11).

The 16 calculated transition metric values are supplied to a second computing chip RB2 by four parallel databus lines (in each case one databus line per memory BF1–4).

The second computing chip RB2 performs the recursive calculation of the forward and reverse recursion metric values. It has 16 adders ADD_1, ADD_2, ..., ADD_16, arranged in parallel, 8 maximum units MAX1, MAX2, ..., MAX8, arranged in parallel and 4 buffers ZS1, ZS2, ZS3 and ZS4, arranged in parallel.

Each of the adders ADD_1–4 adds a transition metric value to a forward or reverse recursion metric value which has been determined in the preceding recursion step—i.e. in the case of forward recursion to an initial state and in the case of reverse recursion to an end state.

To calculate the forward recursion metric values, the butterfly B1 will first be considered by way of an example. The first adder ADD_1 adds the transition metric $\gamma_n^0(R_n, m'=0, m=0)$ to the forward recursion metric value $\alpha_{n-1}(m'=0)$ calculated in the preceding recursion step, resulting in a first possible value $\alpha_n^0(m=0)$ for the new forward recursion metric value $\alpha_n(m=0)$ and the second adder ADD_2 adds the transition metric $\gamma_n^1(R_n, m'=4, m=0)$ to the forward recursion metric value $\alpha_{n-1}(m'=4)$ calculated in the preceding recursion step, resulting in a second possible value $\alpha_n^1(m=0)$ for the new forward recursion metric value $\alpha_n(m=0)$. The raised index of the possible forward recursion metric values specifies the input bit causing the respective transition.

These two possibilities of reaching the end state m=0 are alternative according to the uppermost butterfly B1 shown in FIG. 8C.

The further adders operate analogously, i.e. the adders ADD_3 and ADD_4 calculate corresponding expressions with respect to the two alternatives in order to reach the other end state m=1 of the first butterfly B1, etc.

In general, it holds true that each pair of adders ADD_1/2, ADD_3/4, ..., ADD_15/16, processing such alternative transition metric values is in each case followed by a maximum unit MAX1, MAX2, ..., MAX8. The maximum units MAX1, MAX2, ..., MAX8 select the more probable one of the two alternative transitions by discarding in each case the smaller one of the two possible values $\alpha_n^0(m)$, $\alpha_n^1(m)$ for the $\alpha_n(m)$. These forward recursion metric values $\alpha_n(m)$ form the starting point for the next recursion step n after n+1.

In RB2, therefore, 8 forward recursion metric values $\alpha_n(m)$ for 4 butterflies are determined simultaneously in parallel data processing. The 8 calculated forward recursion metric values $\alpha_n(m)$ are temporarily stored in the buffers ZS1, ZS2, ZS3, ZS4 for the purpose of calculating the recursion. The results $\alpha_n^0(m)$ and $\alpha_n^1(m)$ of the adders ADD_1–16 are supplied via the databus IDB to the forward recursion memory areas RAM_FD_0 and RAM_FD_1, respectively, where they are stored. They are used later in the computing chip RB3.

With the data rate of 384 kbit/s used in UMTS, all 16 possible forward recursion metric values $\alpha_n^0(m)$, $\alpha_n^1(m)$ must be calculated, and stored in the forward recursion memory areas RAM_FD_0 and RAM_FD_1 within a 52-MHz cycle.

The reverse recursion metric values are calculated analogously but on the basis of transitions from an end state m to a starting state m'. The reverse recursion metric values calculated in the reverse recursion for the time n considered are also stored temporarily (i.e. only for the purpose of the recursion for use in the respective next recursion step) in the respective buffer ZS1, ZS2, ZS3 and ZS4. The buffers thus contain the forward and reverse recursion metric values of a butterfly for a particular time n.

It is not necessary to store the calculated reverse recursion metric values over the recursion run (differently from the forward recursion metric values in RAM_FD_0 and RAM_FD_1) since the reverse recursion metric values can be processed further immediately in the third computing chip RB3.

The third computing chip RB3 provided for calculating the LLR output values comprises 16 adders L_ADD_1, L_ADD_2, ..., L_ADD_16, two maximum units MAX_1 and MAX_2, and a subtractor SUB.

The third computing chip RB3 converts the relationship specified in equation (5) for the calculation of the LLRs in accordance with an approximation expression $$\max_{m=0,...,7}\{\alpha_n^1(m) + \beta_n(m)\} - \max_{m=0,...,7}\{\alpha_n^0(m) + \beta_n(m)\}.$$

The approximation expression is proposed in the article "Comparison of Turbo Code Decoders Applied to Short Frame Transmission Systems", Peter Jung, IEEE Journal of Selected Areas in Communications, Vol. 14, No. 3, April 1996, which is herewith incorporated by reference. The first 8 adders L_ADD_1–8 are responsible for the addition of the forward recursion metric values to i=1 with the associated reverse recursion metric values (i.e. for the hypothesis $u_n=1$), i.e. each adder forms the sum $\alpha_n^1(m)+\beta_n(m)$ for one of the 8 states. The second 8 adders L_ADD_9–16 are responsible for the addition of the forward recursion metric values to i=0 with associated reverse recursion metric values (i.e. for the hypothesis $u_n=0$), i.e. each adder forms the sum $\alpha_n^0(m)+\beta_n(m)$ for one of the 8 states.

The maximum unit MAX_1 receives the outputs of the first 8 adders L_ADD_1–8 and the maximum unit MAX_2 receives the outputs of the second 8 adders L_ADD_9–16. Each maximum unit MAX_1 and MAX_2, respectively, finds the respective maximum adder output by comparing all eight adder outputs and forwards it to the subtractor SUB. Thus, MAX_1 determines the value with the maximum probability among all transitions caused by an input bit i=1 and MAX_2 determines the value with the maximum probability among all transitions caused by an input bit i=0. Using the logarithmic property ln(a/b)=ln(a)−ln(b), the subtractor SUB calculates as the difference between these result values the reliability information, i.e. the LLR value $z1_n$(it_no) (in the MAP1 mode) and the LLR value $z2_n$(it_no) (in the MAP2 mode) respectively.

Since both the second computing chip RB2 and the third computing chip RB3 in each case contains 16 adders, these two computing chips can also be combined in a common computing chip having also only 16 adders in total. In this case, the 16 adders are operated in multiplex, i.e. the forward and reverse recursion metric values and the LLRs must be calculated alternately. The advantage consists in a reduction in the hardware expenditure.

We claim:

1. A turbo decoder assembly for decoding a data signal error-protection-coded with a turbo code based on parallel concatenated convolutional codes with interleaving at a transmitter end, transmitted via a disturbed transmission channel, and received in a receiver, comprising:

a turbo decoder having a first computing device, a second computing device, and a bidirectional interface connected between said first and second computing devices for transferring data between said first and second computing devices, said turbo decoder being configured to iteratively decode a data signal received in the receiver in a computing loop, to be passed a plurality of times, and performing the following computing steps:
   (a) first symbol estimation of an input data signal, taking into consideration a first partly redundant data signal and a feedback data signal;
   (b) interleaving of the data signal calculated in the first symbol estimation;
   (c) second symbol estimation of the interleaved data signal, taking into consideration a second partly redundant data signal; and
   (d) deinterleaving of the data signal calculated in the second symbol estimation, for determining the feedback data signal;

said first computing device being configured to carry out steps (a) and (c), said first computing device including only one hardware-based symbol estimator being alternately used for carrying out computing steps (a) and (c); and said second computing device being configured to carry out steps (b) and (d), said second computing device being a software-based digital signal processor.

2. The turbo decoder according to claim 1, wherein:

said computing loop contains a further computing step of calculating statistical information representing an instantaneous channel state; and said second computing device is configured to carry out the further computing step.

3. The turbo decoder according to claim 1, wherein said bidirectional interface has two DMA channels allocated thereto.

4. The turbo decoder according to claim 1, wherein:

said first computing device is configured to calculate, with knowledge of the error protection code used at the transmitter end:
  transition metric values;
  forward and reverse recursion metric values; and therefrom,
  output values that are representative of a probability with which a data symbol of the detected data signal to be estimated has a particular value; and said first computing device contains a hardware computing chip, constructed of combinatorial logic, for generating at least one type of the values.

5. The turbo decoder according to claim 4, wherein said first computing device comprises:

a first hardware computing chip, constructed of combinatorial logic, for generating the transition metric values;

a second hardware computing chip, constructed of combinatorial logic, for generating the forward and reverse recursion metric values; and a third hardware computing chip, constructed of combinatorial logic, for generating the output values.

6. A method for turbo decoding a data signal error-protection-coded with a turbo code based on parallel concatenated convolutional codes with interleaving at a transmitter end, transmitted via a disturbed channel, and detected in a receiver, the method which comprises:

iteratively decoding the data signal detected in the receiver in a computing loop, to be passed several times and containing the following computing steps:
  (a) first symbol estimation of an input data signal, taking into consideration a first partly redundant data signal and a feedback data signal,
  (b) interleaving of the data signal calculated in the first symbol estimation,
  (c) second symbol estimation of the interleaved data signal, taking into consideration a second partly redundant data signal, and
  (d) deinterleaving the data signal calculated in the second symbol estimation, for determining the feedback data signal;

and thereby computing steps (a) and (c) in a first computing device by carrying out the computing steps (a) and (c) with only one hardware-based symbol estimator in the first computing device being alternately used for carrying out computing steps (a) and (c), and computing steps (b) and (d) in a second computing device by carrying out the computing steps (b) and (d) by processing a program with a digital signal processor; and performing within one computing loop pass, two bidirectional data transfer operations between the first and second computing devices.

7. The method according to claim 6, which comprises carrying out the computing steps by a first computing device that is substantially constructed in hardware.

8. The method according to claim 6, which comprises carrying out the computing steps by a first computing device that is completely constructed in hardware.

9. The method according to claim 6, which comprises effecting the data transfer by a direct memory access.

* * * * *